(12) United States Patent
Zheng et al.

(10) Patent No.: US 11,940,512 B2
(45) Date of Patent: Mar. 26, 2024

(54) SYSTEMS AND METHODS FOR BODY COIL AIR COOLING

(71) Applicant: GE Precision Healthcare LLC, Wauwatosa, WI (US)

(72) Inventors: Yanchun Zheng, Beijing (CN); Hong Jiang, Beijing (CN); Kun Wang, Beijing (CN); Huaiyu Dong, Beijing (CN); Hailiang Liu, Beijing (CN); Saban Kurucay, Waukesha, WI (US); Jian Cao, Beijing (CN)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 0 days.

(21) Appl. No.: 17/820,752

(22) Filed: Aug. 18, 2022

(65) Prior Publication Data

US 2024/0061058 A1    Feb. 22, 2024

(51) Int. Cl.
*G01R 33/34* (2006.01)
(52) U.S. Cl.
CPC ................ *G01R 33/3403* (2013.01)
(58) Field of Classification Search
CPC  G01R 33/00; G01R 33/0035; G01R 33/0023; G01R 33/0017; G01R 31/3191; G01R 33/0358; G01R 33/0356; G01R 33/3403; G01B 7/004; G01C 17/38; G06F 3/017; G06F 3/0346; G06F 3/012; H01L 39/223
See application file for complete search history.

(56) References Cited

U.S. PATENT DOCUMENTS

| | | | |
|---|---|---|---|
| 10,573,031 B2 | 2/2020 | Mailhe et al. | |
| 11,037,053 B2 | 6/2021 | Moon | |
| 11,176,428 B2 | 11/2021 | Lee et al. | |
| 11,288,775 B2 | 3/2022 | Tohme et al. | |
| 2006/0215808 A1* | 9/2006 | Lacey | A61B 6/037 378/19 |
| 2018/0035957 A1* | 2/2018 | Liu | F28D 1/035 |
| 2018/0177473 A1* | 6/2018 | Gregerson | A61B 6/508 |
| 2019/0105005 A1* | 4/2019 | Arber | G01R 33/4808 |
| 2019/0172230 A1* | 6/2019 | Mailhe | G06T 5/002 |
| 2021/0158486 A1 | 5/2021 | Tohme et al. | |

FOREIGN PATENT DOCUMENTS

CN    112801887 A    5/2021

* cited by examiner

*Primary Examiner* — Jermele M Hollington
*Assistant Examiner* — Taqi R Nasir
(74) *Attorney, Agent, or Firm* — McCoy Russell LLP

(57) ABSTRACT

Methods and systems are provided for cooling hot spots on a body coil assembly of an MRI system. In one embodiment, an airflow guide of a body coil assembly of an MRI system comprises a first surface that forms an air passage when the airflow guide is positioned on the body coil assembly, the air passage enclosed by the first surface and a second, outer surface of an RF coil of the body coil assembly, the airflow guide configured to channel cool air generated by a fan to the second, outer surface of the RF coil. The airflow guide may be arranged circumferentially around a portion of the RF coil at one or more ends of the RF coil. The airflow guide may be manufactured as a plurality of airflow guide segments that are glued together.

20 Claims, 9 Drawing Sheets

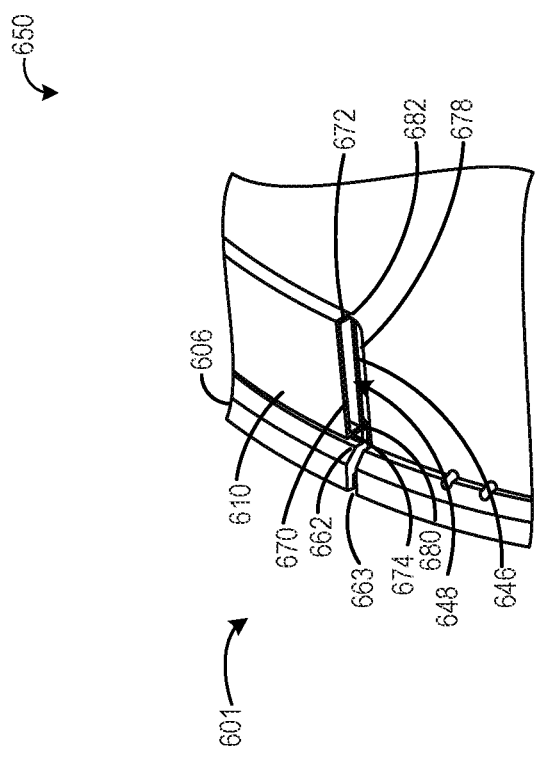
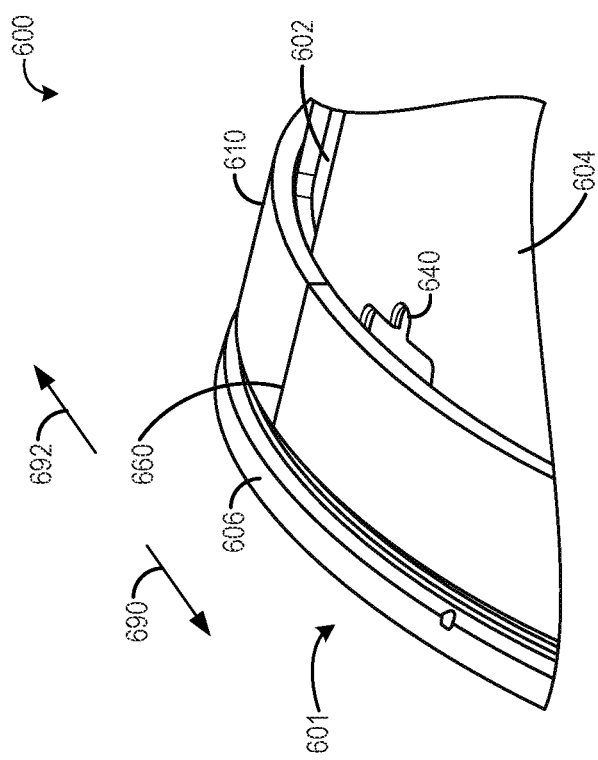

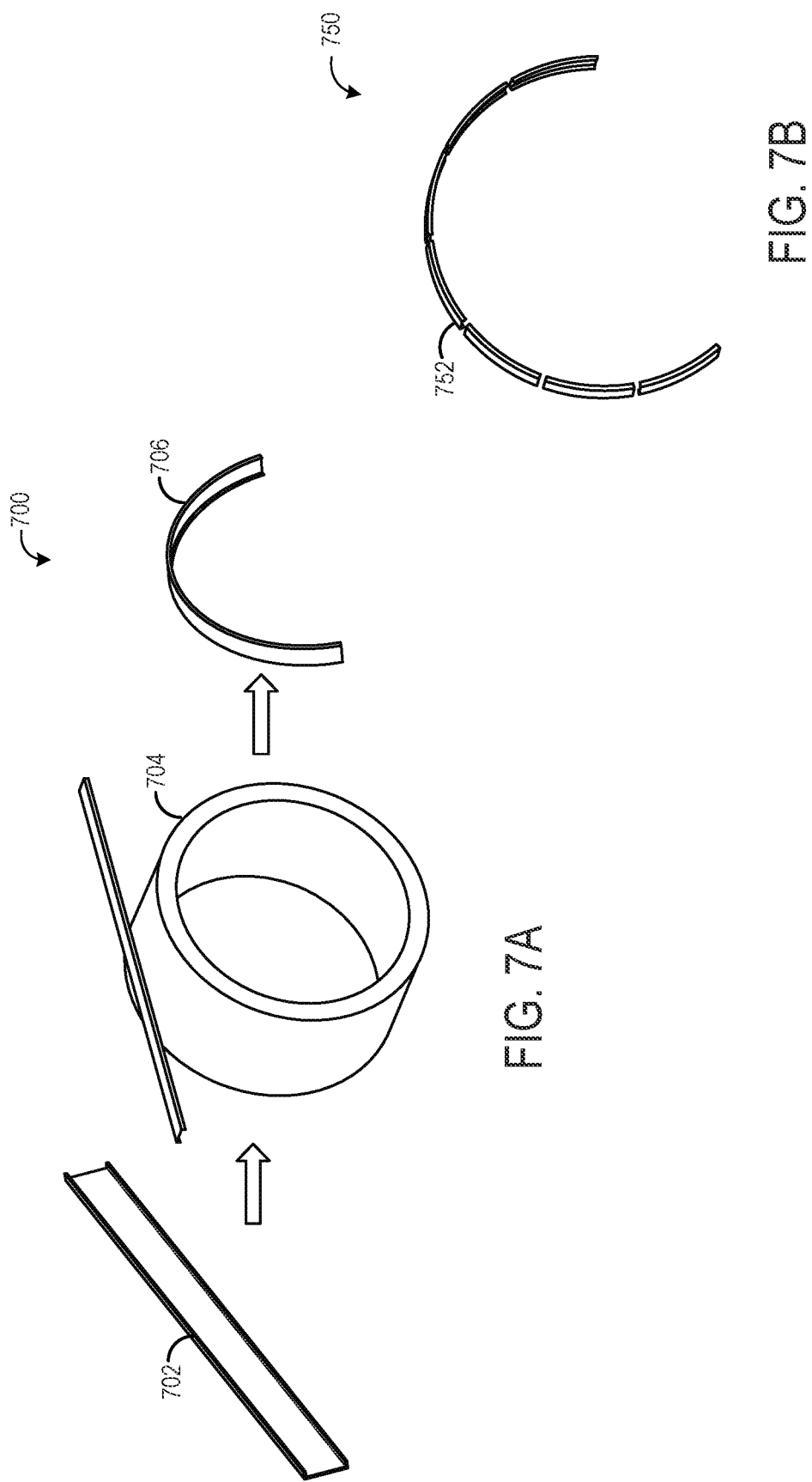

SYSTEMS AND METHODS FOR BODY COIL AIR COOLING

TECHNICAL FIELD

Embodiments of the subject matter disclosed herein relate to magnetic resonance imaging (MRI) body coils, and more particularly, to thermal management of the body coils.

BACKGROUND

Medical imaging systems such as magnetic resonance imaging (MRI) systems, computed tomography (CT) systems, positron emission tomography (PET) systems, X-ray systems, ultrasound systems, etc., are widely used to obtain internal physiological information of a subject (e.g., a patient). Images from any of these modalities may comprise three-dimensional (3D) data, oftentimes divided into a plurality of slices, organized by depth. Images of various body parts may include a number of internal anatomical features, such as organs, bones, and soft tissue. Furthermore, the images may capture some anatomical abnormalities in detail, such as tumors, cysts, and the like.

A magnetic resonance imaging (MRI) system may include a body coil unit surrounding an imaging space within which the subject is positioned. The MRI system transmits electromagnetic pulse signals to the subject placed in the imaging space with a static magnetic field formed to perform an MRI for obtaining magnetic resonance signals from the subject. An image of a slice of the subject may be reconstructed based on the magnetic resonance signals thus obtained by the MRI.

During the MRI, heat may be generated in the body coil unit and in the imaging space. To reduce the heat, the body coil unit may be cooled by flowing cool air across an interior of an RF coil of the body coil unit. However, the airflow may cool some locations of the body coil unit more than other locations. Hot spots may be generated in the body coil unit that do not receive sufficient airflow to be cooled. The hot spots may cause discomfort to the subject, or cutaneous burns.

SUMMARY

The current disclosure at least partially addresses one or more of the above identified issues by an airflow guide of a body coil assembly of an MRI system, the airflow guide comprising a first surface that forms an air passage when the airflow guide is positioned on the body coil assembly, the air passage enclosed by the first surface and a second, outer surface of an RF coil of the body coil assembly, the airflow guide configured to channel cool air generated by a fan to the second, outer surface of the RF coil.

The above advantages and other advantages, and features of the present description will be readily apparent from the following Detailed Description when taken alone or in connection with the accompanying drawings. It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Various aspects of this disclosure may be better understood upon reading the following detailed description and upon reference to the drawings in which:

FIG. 6A is a schematic diagram showing an airflow inlet of an airflow guide of an MRI body coil, in accordance with one or more embodiments of the present disclosure;

FIG. 6B is a schematic diagram showing an airflow outlet of an airflow guide of an MRI body coil, in accordance with one or more embodiments of the present disclosure;

FIG. 7A shows a first manufacturing method of an airflow guide of an MRI body coil, in accordance with one or more embodiments of the present disclosure;

FIG. 7B shows segments of an airflow guide of an MRI body coil, in accordance with one or more embodiments of the present disclosure;

Figure 1:
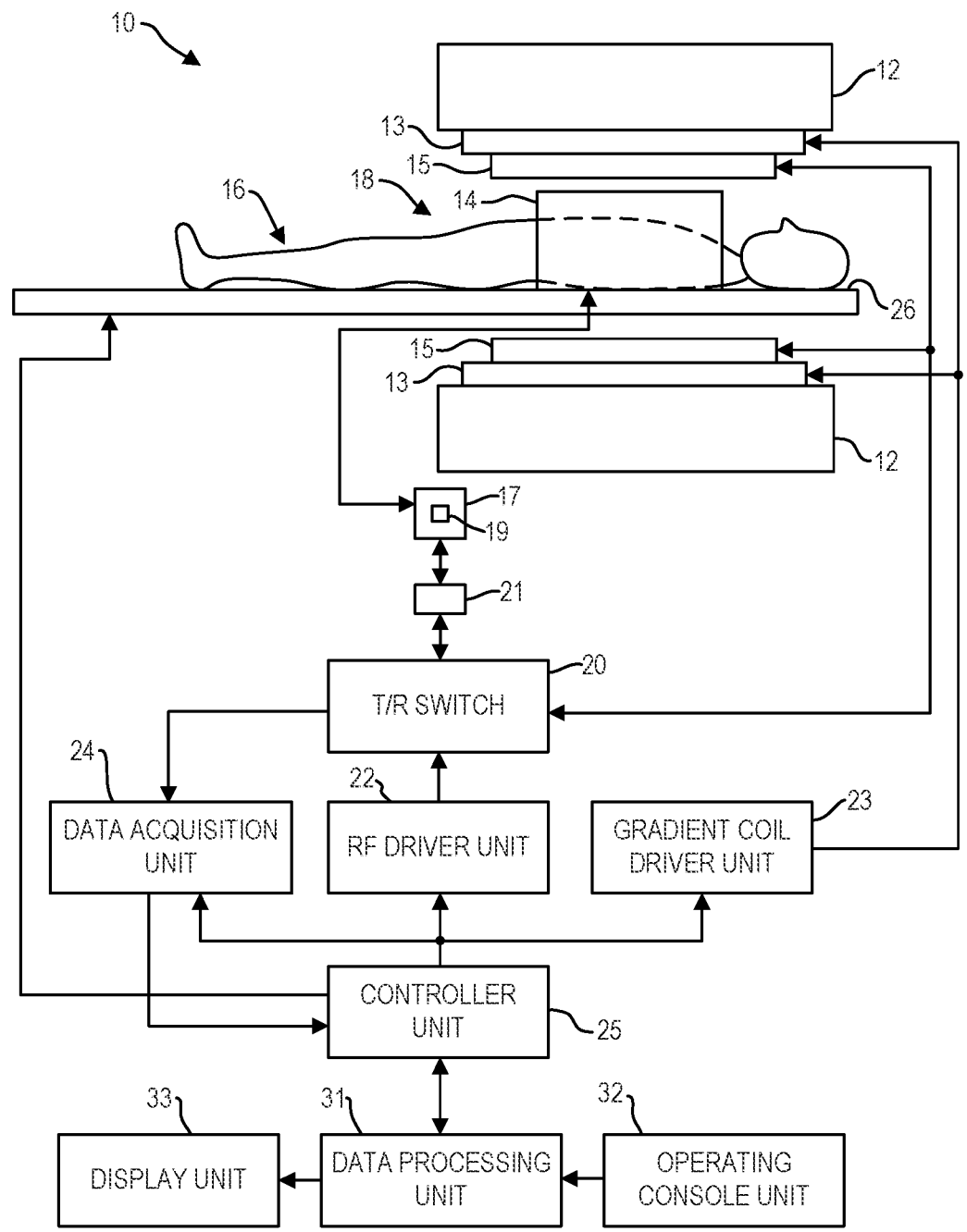
FIG. 1 is a schematic diagram illustrating a medical imaging system, including an image processing module.

The drawings illustrate specific aspects of the described systems and methods. Together with the following description, the drawings demonstrate and explain the structures, methods, and principles described herein. In the drawings, the size of components may be exaggerated or otherwise modified for clarity. Well-known structures, materials, or operations are not shown or described in detail to avoid obscuring aspects of the described components, systems and methods.

DETAILED DESCRIPTION

This description and embodiments of the subject matter disclosed herein relate to methods and systems for thermal management of radio frequency (RF) coils for magnetic resonance imaging (MRI) systems.

MRI is a medical imaging modality that can produce images of an interior of a patient without x-ray radiation or other types of ionizing radiation. An MRI system is a medical imaging device utilizing a superconducting magnet to create a strong, uniform, static magnetic field within a designated region (e.g., within a passage shaped to receive a patient). When a body of a patient (or portion of the body of the patient) is positioned within the magnetic field, nuclear spins associated with the hydrogen nuclei that form water within tissues of the patient become polarized. The magnetic moments associated with these spins become aligned along the direction of the magnetic field and result in a small net tissue magnetization in the direction of the magnetic field. MRI systems additionally include magnetic gradient coils that produce spatially-varying magnetic fields of smaller magnitudes relative to a magnitude of the uniform magnetic field resulting from the superconducting magnet. The spatially-varying magnetic fields are configured to be orthogonal to each other in order to spatially encode the region by creating a signature resonance frequency of the hydrogen nuclei at different locations in the body of the patient.

Radio frequency (RF) coil assemblies, such as a body coil assembly, are then used to create pulses of RF energy at or near the resonance frequency of the hydrogen nuclei. The pulses of RF energy are absorbed by the hydrogen nuclei, thereby adding energy to the nuclear spin system and adjusting the hydrogen nuclei from a rest state to an excited state. As the hydrogen nuclei relax back to the rest state from the excited state, they release the absorbed energy in the form of an RF signal. This signal is detected by the MRI system and is transformed into an image using reconstruction algorithms.

In order to detect the RF signals emitted by the body of the patient, a local RF coil assembly may be positioned proximate to one or more anatomical features to be imaged by the MRI system. An image quality of images produced by the MRI system is dependent on a distance of the local RF coil assembly from a transmitter of the signals received by the local RF coil assembly (such as the one or more anatomical features).

Heat may be generated in the body coil assembly as a result of introducing currents into the RF coils and the gradient coil induced eddy current heating of RF body coil. Heat generated in the body coil assembly may be dissipated by flowing cool air through portions of the body coil assembly using a fan. The fan may be an external fan positioned proximate to the body coil assembly, where the cool air is routed into an inlet of the body coil via a hose. In one embodiment, the hose is a flexible plastic hose. The cool air may flow across looped wires of the body coil and exit via an outlet of the body coil assembly. However, heat may not be distributed evenly around the body coil. More heat may be generated or retained at some areas of the body coil than other areas, and the cool air flowed across the body coil may not efficiently cool all parts of the body coil. As a result, some locations on or within the body coil may be hotter than others (e.g., hot spots). For example, the hot spots may be caused at focal points of the RF signals near coils of the body coil. A temperature of a hot spot may be high enough to cause a cutaneous burn on skin of a subject. Additionally, a current may be induced in a wire or cable passing through a hot spot, which may reduce an efficiency of the MRI system. To reduce a temperature of the hot spots, a local cooling method is proposed herein that directs an airflow to the hot spots via an airflow guide arranged on a surface of the body coil assembly.

Figure 2:
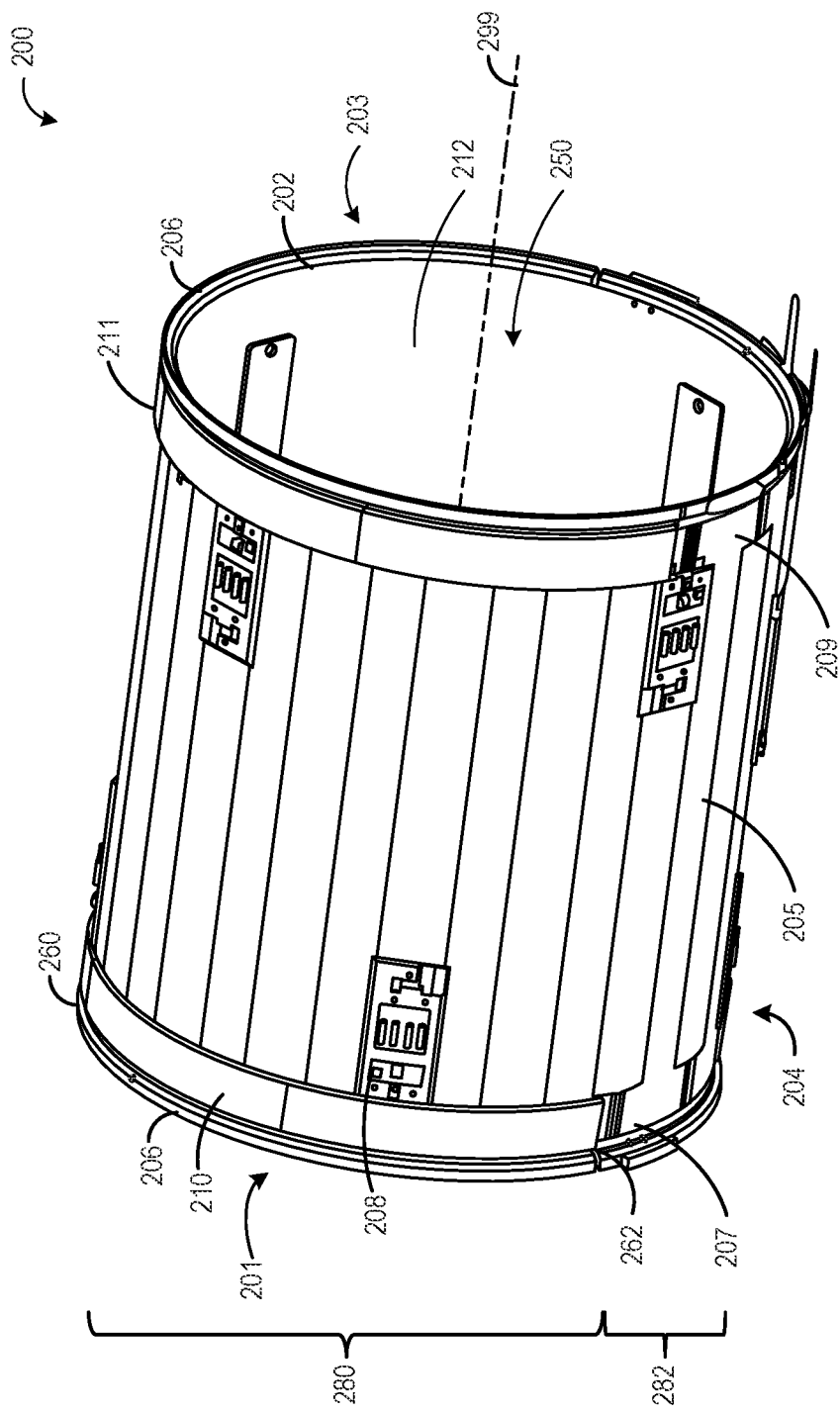
FIG. 2 shows a first perspective view of an MRI body coil including an airflow guide, in accordance with one or more embodiments of the present disclosure.
Figure 3:
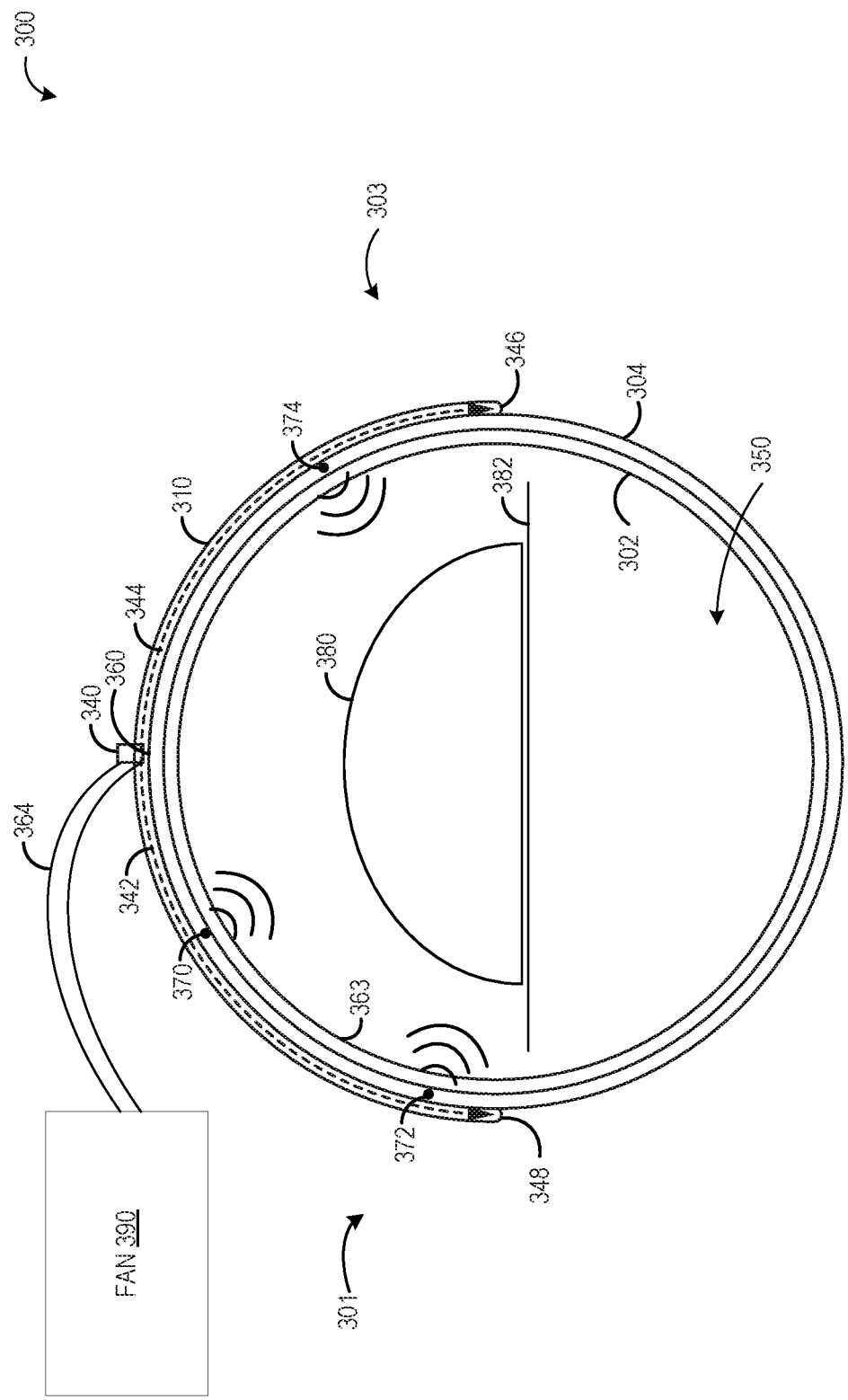
FIG. 3 shows a second perspective view of an MRI body coil including an airflow guide, in accordance with one or more embodiments of the present disclosure.
Figure 4:
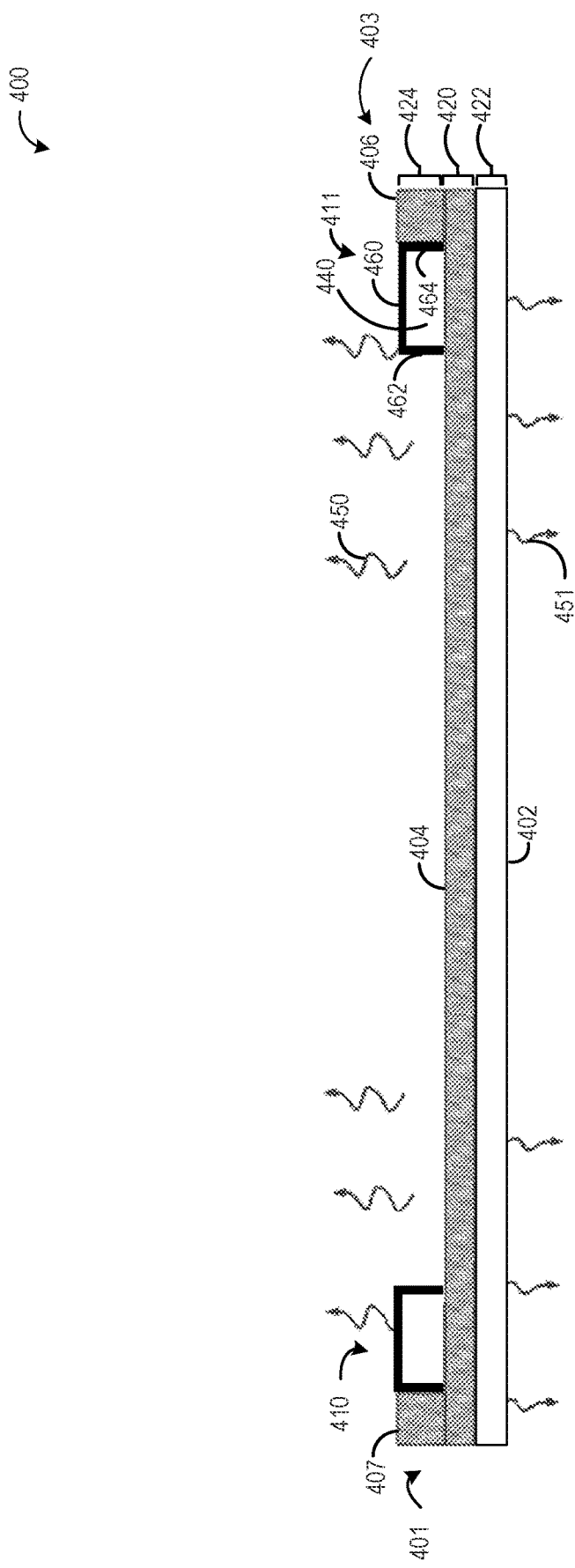
FIG. 4 shows a third perspective view of an MRI body coil including an airflow guide, in accordance with one or more embodiments of the present disclosure.
Figure 5A:
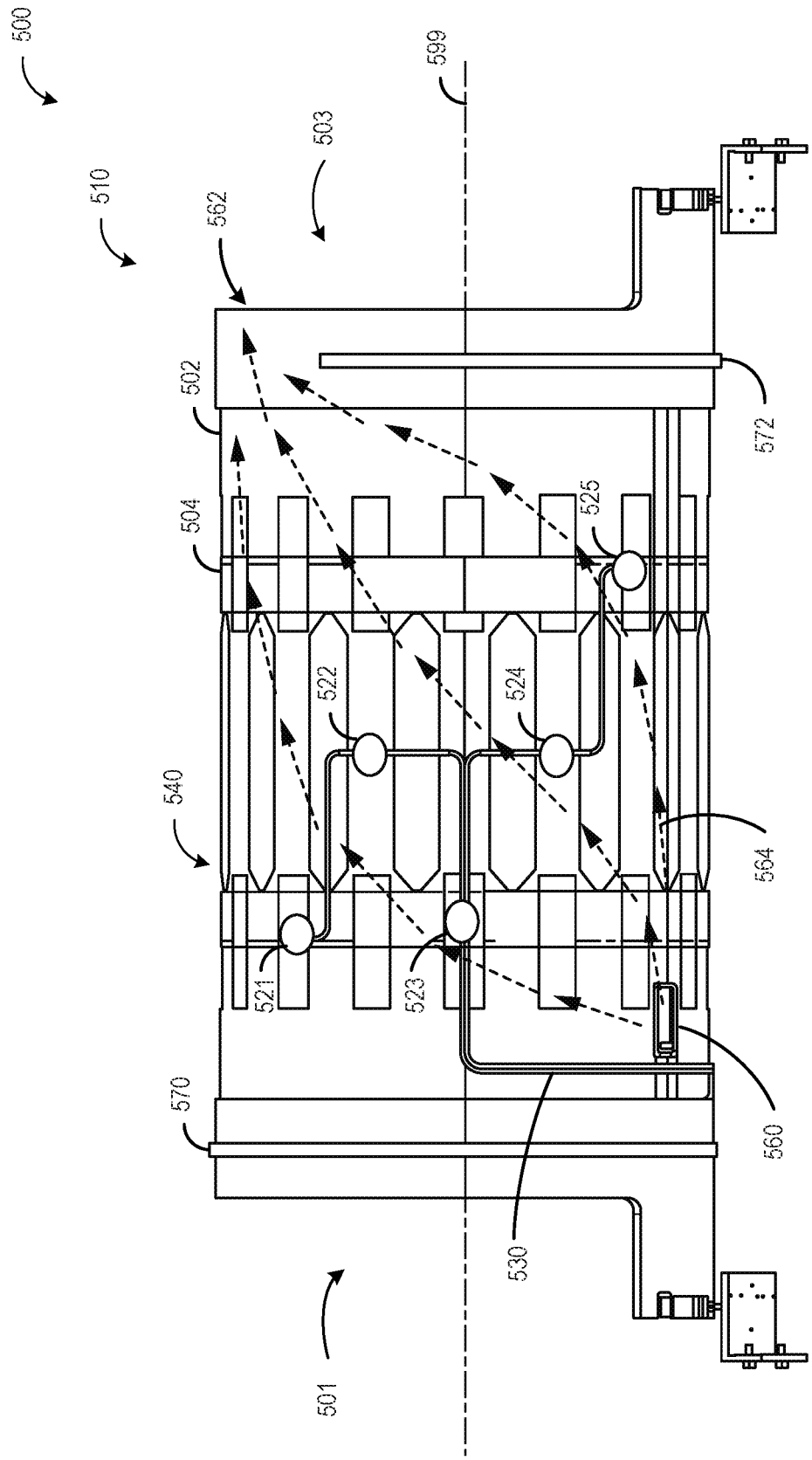
FIG. 5A is a first schematic diagram showing an airflow through an MRI body coil, in accordance with one or more embodiments of the present disclosure.
Figure 5B:
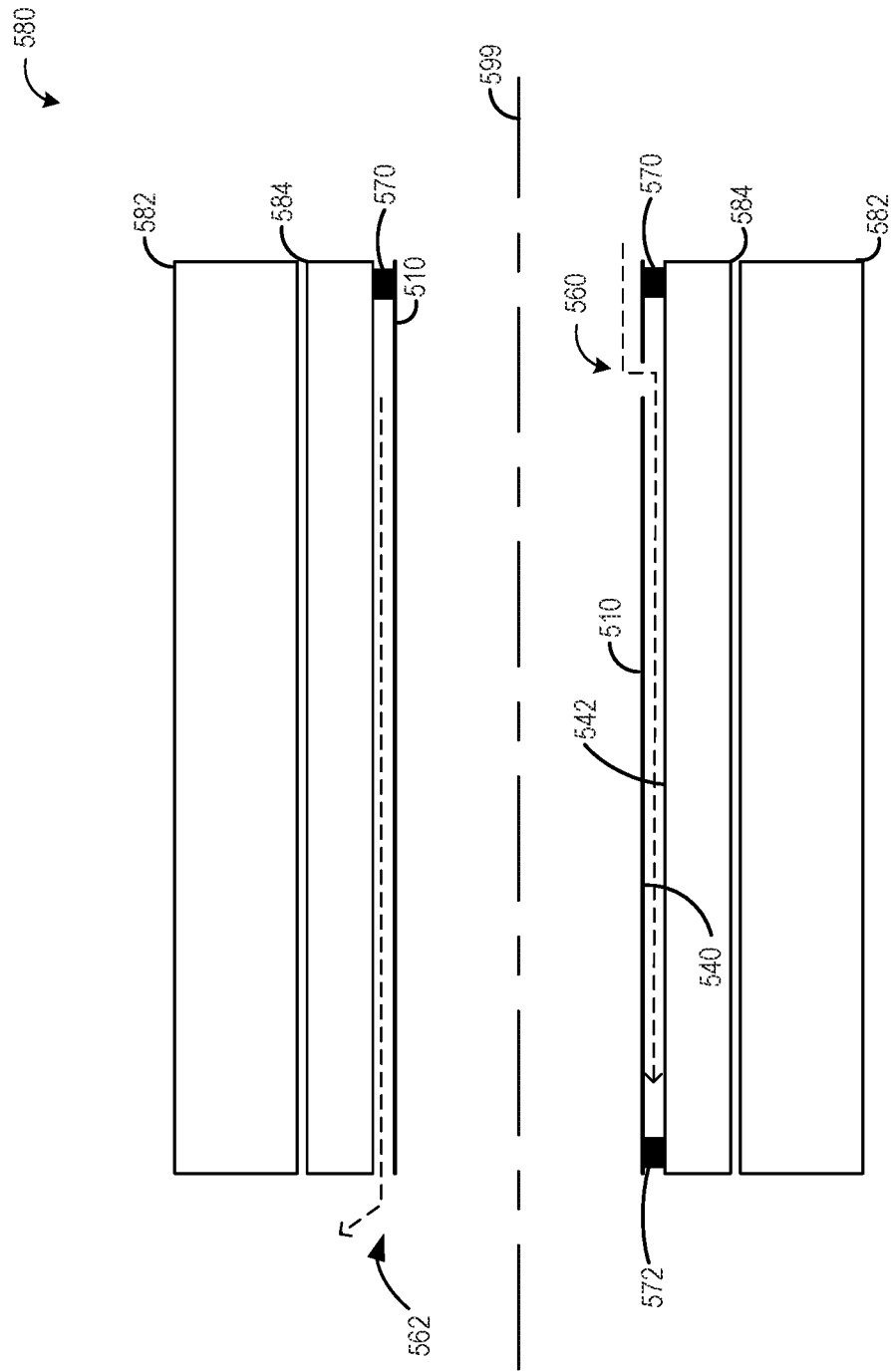
FIG. 5B is a second schematic diagram showing an airflow through an MRI body coil, in accordance with one or more embodiments of the present disclosure.

FIG. 1 shows an exemplary MRI system including a body coil. Hot spots may be generated on or within the body coil at various locations, as shown in FIG. 5A, where the hot spots may not be cooled by a flow of air across coils within the body coil, as shown in FIG. 5B. To cool the hot spots, one or more airflow guides may be mechanically coupled to an exterior of the body coil that direct air to locations of the body coil where the hot spots are generated, as shown in FIG. 2. The airflow guides may extend circumferentially around a portion of the body coil, as shown in FIG. 3. FIG. 4 shows a side view of two airflow guides positioned at two ends of the body coil. Cool air may be routed from one or more inlets of an airflow guide, as shown in FIG. 6A, to one or more outlets of the airflow guide, as shown in FIG. 6B. In some embodiments, an airflow guide may be manufactured by hot bending, as illustrated in FIG. 7A. The airflow guide may also comprise a plurality of airflow guide segments, as indicated in FIG. 7B. By including the one or more airflow guides on the body coil, a temperature of the hot spots may be decreased, as shown in the graphs shown in FIGS. 8A and 8B.

FIGS. 1-6 show example configurations with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space therebetween and no other components may be referred to as such, in at least one example. As yet another example, elements shown above/below/underneath one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example.

FIG. 1 illustrates an MRI system 10 that includes a magnetostatic field magnet unit 12, a gradient coil unit 13, an RF coil unit 14, an RF body coil unit 15, a transmit/receive (T/R) switch 20, an RF driver unit 22, a gradient coil driver unit 23, a data acquisition unit 24, a controller unit 25, a patient table or bed 26, an image processing system 31, a user input device 32, a display device 33, and an imaging archive 35. In some embodiments, the RF coil unit 14 is a surface coil, which is a local coil typically placed proximate to the anatomy of interest of a subject 16. Herein, the RF body coil unit 15 is a transmit coil that transmits RF signals, and the local surface RF coil unit 14 receives the MR signals. As such, the transmit body coil (e.g., RF body coil unit 15) and the surface receive coil (e.g., RF coil unit 14) are separate but electromagnetically coupled components. The MRI system 10 transmits electromagnetic pulse signals to the subject 16 placed in an imaging space 18 with a static magnetic field formed to perform an MRI for obtaining magnetic resonance signals from the subject 16. One or more MR images of the subject 16 can be reconstructed based on the magnetic resonance signals thus obtained by the MRI.

The magnetostatic field magnet unit 12 includes, for example, an annular superconducting magnet, which is mounted within a toroidal vacuum vessel. The magnet defines a cylindrical space surrounding the subject 16 and generates a constant primary magnetostatic field $B_0$.

The MRI system 10 also includes a gradient coil unit 13 that forms a gradient magnetic field in the imaging space 18 so as to provide the magnetic resonance signals received by the RF coil arrays with three-dimensional positional information. The gradient coil unit 13 includes three gradient coil systems, each of which generates a gradient magnetic field along one of three spatial axes perpendicular to each other, and generates a gradient field in each of a frequency encoding direction, a phase encoding direction, and a slice selection direction in accordance with the imaging condition. More specifically, the gradient coil unit 13 applies a gradient field in the slice selection direction (or scan direction) of the subject 16, to select the slice; and the RF body coil unit 15 or the local RF coil arrays may transmit an RF pulse to a selected slice of the subject 16. The gradient coil unit 13 also applies a gradient field in the phase encoding direction of the subject 16 to phase encode the magnetic resonance signals from the slice excited by the RF pulse. The gradient coil unit 13 then applies a gradient field in the frequency encoding direction of the subject 16 to frequency encode the magnetic resonance signals from the slice excited by the RF pulse.

The RF coil unit 14 is disposed, for example, to enclose the region to be imaged of the subject 16. In some examples, the RF coil unit 14 may be referred to as the surface coil or the receive coil. In the static magnetic field space or imaging space 18 where a static magnetic field $B_0$ is formed by the magnetostatic field magnet unit 12, the RF coil unit 15 transmits, based on a control signal from the controller unit 25, an RF pulse that is an electromagnet wave to the subject 16 and thereby generates a high-frequency magnetic field, $B_1$. This excites a spin of protons in the slice to be imaged of the subject 16. The RF coil unit 14 receives, as a magnetic resonance signal, the electromagnetic wave generated when the proton spin thus excited in the slice to be imaged of the subject 16 returns into alignment with the initial magnetization vector. In some embodiments, the RF coil unit 14 may transmit the RF pulse and receive the MR signal. In other embodiments, the RF coil unit 14 may only be used for receiving the MR signals, but not transmitting the RF pulse.

The RF body coil unit 15 is disposed, for example, to enclose the imaging space 18, and produces RF magnetic field pulses orthogonal to the main magnetic field $B_0$ produced by the magnetostatic field magnet unit 12 within the imaging space 18 to excite the nuclei. In contrast to the RF coil unit 14, which may be disconnected from the MRI system 10 and replaced with another RF coil unit, the RF body coil unit 15 is fixedly attached and connected to the MRI system 10. Furthermore, whereas local coils such as the RF coil unit 14 can transmit to or receive signals from only a localized region of the subject 16, the RF body coil unit 15 generally has a larger coverage area. The RF body coil unit 15 may be used to transmit or receive signals to the whole body of the subject 16, for example. Using receive-only local coils and transmit body coils provides a uniform RF excitation and good image uniformity at the expense of high RF power deposited in the subject. For a transmit-receive local coil, the local coil provides the RF excitation to the region of interest and receives the MR signal, thereby decreasing the RF power deposited in the subject. It should be appreciated that the particular use of the RF coil unit 14 and/or the RF body coil unit 15 depends on the imaging application.

The T/R switch 20 can selectively electrically connect the RF body coil unit 15 to the data acquisition unit 24 when operating in receive mode, and to the RF driver unit 22 when operating in transmit mode. Similarly, the T/R switch 20 can selectively electrically connect the RF coil unit 14 to the data acquisition unit 24 when the RF coil unit 14 operates in receive mode, and to the RF driver unit 22 when operating in transmit mode. When the RF coil unit 14 and the RF body coil unit 15 are both used in a single scan, for example if the RF coil unit 14 is configured to receive MR signals and the RF body coil unit 15 is configured to transmit RF signals, then the T/R switch 20 may direct control signals from the RF driver unit 22 to the RF body coil unit 15 while directing received MR signals from the RF coil unit 14 to the data acquisition unit 24. The coils of the RF body coil unit 15 may be configured to operate in a transmit-only mode or a transmit-receive mode. The coils of the local RF coil unit 14 may be configured to operate in a transmit-receive mode or a receive-only mode.

The RF driver unit 22 includes a gate modulator (not shown), an RF power amplifier (not shown), and an RF oscillator (not shown) that are used to drive the RF coils (e.g., RF coil unit 15) and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil unit 15.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a pre-amplifier (not shown), a phase detector (not shown), and an analog/digital converter (not shown) used to acquire the magnetic resonance signals received by the RF coil unit 14. In the data acquisition unit 24, the phase detector phase detects, using the output from the RF oscillator of the RF driver unit 22 as a reference signal, the magnetic resonance signals received from the RF coil unit 14 and amplified by the pre-amplifier, and outputs the phase-detected analog magnetic resonance signals to the analog/digital converter for conversion into digital signals. The digital signals thus obtained are output to the image processing system 31.

The MRI system 10 includes a table 26 for placing the subject 16 thereon. The subject 16 may be moved inside and outside the imaging space 18 by moving the table 26 based on control signals from the controller unit 25.

The controller unit 25 includes a computer and a recording medium on which a program to be executed by the computer is recorded. The program when executed by the computer causes various parts of the system to carry out operations corresponding to pre-determined scanning. The recording medium may comprise, for example, a ROM, flexible disk, hard disk, optical disk, magneto-optical disk, CD-ROM, or non-transitory memory card. The controller unit 25 is connected to the user input device 32 and processes the operation signals input to the user input device 32 and furthermore controls the table 26, RF driver unit 22, gradient coil driver unit 23, and data acquisition unit 24 by outputting control signals to them. The controller unit 25 also controls, to obtain a desired image, the image processing system 31 and the display device 33 based on operation signals received from the user input device 32.

The user input device 32 includes user input devices such as a touchscreen, keyboard and a mouse. The user input device 32 is used by an operator, for example, to input such data as an imaging protocol and to set a region where an imaging sequence is to be executed. The data about the imaging protocol and the imaging sequence execution region are output to the controller unit 25.

The image processing system 31 includes a processor and non-transitory memory on which machine executable instructions may be stored, wherein the machine executable instructions may enable the processor to execute one or more of the steps of one or more of the methods herein disclosed. The image processing system 31 may be connected to the controller unit 25 and may perform data processing based on control signals received from the controller unit 25 or user input device 32. The image processing system 31 is also connected to the data acquisition unit 24 and generates spectrum data by applying various image processing operations to the magnetic resonance signals output from the data acquisition unit 24.

Using its processor and memory resources, image processing system 31 is configurable to perform input parameter checking and output generation through output consistency enforcement. Image processing system 31 is further communicatively coupled to both display device 33 and user input device 32, allowing image processing system 31 to produce visible and interactive output, usable by clinicians to aid in the generation of treatment plans, for example.

The display device 33 displays an image on the display screen of the display device based on control signals received from the controller unit 25. The display device 33 displays, for example, MR images produced by the image processing system 31. Display device 33 may comprise a graphical user interface, wherein a user may interact with/input/alter one or more data fields via user input device 32. The display device 33 may display a two-dimensional (2D) slice image or three-dimensional (3D) image of the subject 16 generated by the image processing system 31.

During a scan, RF coil array interfacing cables (not shown in FIG. 1) may be used to transmit signals between the RF coils (e.g., RF coil unit 14 and RF body coil unit 15) and other aspects of the processing system (e.g., data acquisition unit 24, controller unit 25, and so on), for example to control the RF coils and/or to receive information from the RF coils. As explained previously, the RF body coil unit 15 is a transmit coil that transmits RF signals, and the local surface RF coil unit 14 receives the MR signals. More generally, RF coils are used to transmit RF excitation signals ("transmit coil"), and to receive the MR signals emitted by an imaging subject ("receive coil"). In some embodiments, the transmit and receive coils are a single mechanical and electrical structure or array of structures, with transmit/receive mode switchable by auxiliary circuitry. In other examples, the transmit body coil (e.g., RF body coil unit 15) and the surface receive coil (e.g., RF coil unit 14) may comprise separate components.

Referring now to FIG. 2, a first perspective view of a body coil assembly 200 of an MRI system is shown. Body coil assembly 200 may be a non-limiting example of the body coil unit 15 of the MRI system 10 of FIG. 1. The body coil assembly may include an RF coil 204 arranged circumferentially around an outer surface of the RF tube 202, where the RF coil 204 and the RF tube 202 are coaxially aligned around a central axis 299. The RF tube 202 may be made of fiberglass or a different non-conductive material, and may have a cylindrical shape that is open on both ends, enclosing an imaging space 250 where a subject (e.g., a patient) may be inserted during an MRI procedure.

The RF coil 204 may be a cylindrical volume or body coil. The RF coil 204 may be configured to include a plurality of longitudinal sections 205 that extend from a rear end 201 of the body coil assembly to a front end 203. The plurality of longitudinal sections 205 may be joined together by one or more circumferential sections, such as a first circumferential section 207 that extends circumferentially around the RF tube 202 at the rear end 201, and a second circumferential section 209 that extends circumferentially around the RF tube 202 at the rear end 201. The RF coil may be made of copper, through which a sinusoidal distribution of currents may be generated to create a transverse magnetic field. As a result of the configuration of the longitudinal sections 205, a homogeneous RF excitation field may be created within the imaging space 250.

As described above in reference to FIG. 1, the homogeneous RF excitation field may be created in pulses by energizing and de-energizing the RF coil 204 at the resonance frequency of hydrogen nuclei at different locations within a body of the subject during a scan. During a pulse, the hydrogen nuclei may be temporarily excited, after which absorbed energy may be released as an RF signal that is detected by the MRI system and transformed into an image. A timing of the pulses and an amount of current transmitted through the RF coil 204 may be controlled by one or more printed circuit boards (PCBs) 208, based on a current supplied by an external power source.

When the RF coil 204 is energized, heat may be generated in and/or at points near the RF coil 204. The heat may radiate to the RF tube 202, generating heat in the imaging space 250. As a result of the heat, a higher-than-desired temperature of the imaging space 250 may cause discomfort to a subject lying therein. Further, the heat generated by the RF coil 204 may not be distributed evenly around the RF tube 202, where some areas of the imaging space 250 or some portions of an inner surface 212 of the RF tube 202 may become hotter than others (e.g., hot spots). Under some circumstances, a temperature of the hot spots may be sufficient to burn the subject's skin. To reduce the temperature of the imaging space and the hot spots, cool air may be flowed across the RF coil 204.

Turning briefly to FIGS. 5A and 5B, 5A shows an airflow diagram 500 indicating an airflow pattern generated across an RF coil 504 arranged circumferentially around an RF tube 502 of a body coil assembly 510, where the RF coil 504 and the RF tube 502 are coaxially aligned around a central axis 599. The RF coil 504 and RF tube 502 may be non-limiting examples of the RF coil 204 and the RF tube 202 of body coil assembly 200 of FIG. 2, where the RF coil 504 may include longitudinal and circumferential sections. In some embodiments, cool air may be flowed across an outer surface of the RF coil 504 from a rear end 501 of the RF coil 504 to a front end 503 of the RF coil 504.

As shown in FIG. 5B, the body coil assembly 510 may be positioned within a gradient coil 584 (e.g., gradient coil 13 of FIG. 1), where the gradient coil 584 is positioned within a magnet 582 (e.g., magnet 12 of FIG. 1). In various embodiments, the cool air may be introduced via an airflow inlet 560 into a space between an outer surface 540 of the RF coil 504 and an inner surface 542 of the gradient coil 584. The space may be sealed by one or more airflow seals 570, 572.

As shown in FIG. 5A, the air may flow across the RF coil 504 to an airflow outlet 562 via a plurality of airflow paths 564 across the surface of the RF coil 504. As the air flows across the RF coil 504, heat from the RF coil may be transferred to the air, and hot air may be released through the airflow outlet 562. For example, the airflow inlet 560 may be positioned at the rear end 501 of the body coil assembly 510, and the airflow outlet 562 may be positioned at the front end 503 of the body coil assembly. The space around the RF coil 504 may include an airflow seal 570 positioned at the rear end 501 of the body coil assembly and extending circumferentially around the RF tube 502 that prevents the air from exiting the space at the rear end 501. The space around the RF coil 504 may include an airflow seal 572 positioned at the front end 503 of the body coil assembly and extending circumferentially around the RF tube 502, where the airflow seal 572 may not extend all the way around the RF tube 502, thereby creating the airflow outlet 562.

Heat may be generated in the RF coil 504 as a result of an electric current introduced into the RF coil 504 via a cable 530. The electric current may be routed through a plurality of circuits electronically connected to coils of the RF coil 504. At various points throughout the RF coil 504 hot spots may be generated. Some of the hot spots may be cooled by the air flowing from the airflow inlet 560 to the airflow outlet 562, and some of the hot spots may not be cooled by the air.

For example, hot spots 521, 522, 523, 524, and 525 may be generated at different locations on the RF coil 504 and/or the RF tube 502 (e.g., at focal points of RF signals generated by the RF coil 504). The plurality of airflow paths 564 across the outer surface of the RF coil 504 may direct cool air to the locations of some of the hot spots, and not to others. A first airflow may be high at the locations of the hot spots 523, 524, and 525, and as a result of the high first airflow, the hot spots 523, 524, and 525 may be cooled by the air. However, a second airflow at the locations of the hot spots 521 and 522 may be lower. As a result of the lower airflow, the hot spots 521 and 522 may not be cooled by the air, and a temperature of areas near the hot spots 521 and 522 on the interior of the RF tube 502 and inside the RF tube 502 may increase. If the temperature increases above a threshold, a subject inside the RF tube 502 may experience discomfort during an MRI.

It should be appreciated that the location and number of hot spots depicted in FIG. 5A are for illustrative purposes, and a greater or lesser number of hot spots may be generated in the same or different locations as those depicted in FIG. 5A.

Returning to FIG. 2, the body coil assembly 200 includes one or more airflow guides 210. In addition to, or as an alternative to cooling a temperature at hot spots on the body coil assembly 200 via cooled air as described above in reference to FIG. 5A, the temperature of the hot spots may be reduced by routing cooled air through the airflow guides, which may direct the cooled air to a location of one or more hot spots.

For example, hot spots may often be concentrated at an end ring 206 of the body coil assembly. In one embodiment, a first airflow guide 210 may be positioned circumferentially around an outside of the body coil assembly along a first end ring 206 at the rear end 201 of the body coil assembly, and a second airflow guide 211 may be positioned circumferentially around the outside of the body coil assembly along a second end ring 206 at the front end 203 of the body coil assembly. The first and second airflow guides 210 and 211 may not extend around an entire circumference of the body coil assembly. In some embodiments, the first and second airflow guides 210 and 211 may extend from a top center point 260 of the body coil assembly down the sides of the body coil assembly to an end point 262, covering a first, upper portion 280 of the circumference of the body coil assembly. The first and second airflow guides 210 and 211 may not extend along a second, lower portion 282 of the circumference of the body coil assembly (e.g. including a bottom side of the body coil assembly).

As described in greater detail below, when positioned on the RF coil 204, the first and second airflow guides 210, 211 may be configured to form an air passage between inner surfaces of one or more flat or curved walls of the airflow guides and a portion of an outer surface of the RF coil 204. For example, in some embodiments, the first and second airflow guides 210, 211 may have three sides, including an upper wall and two side walls, such that an air passage is created between an inner surface of the upper wall, inner surfaces of the two side walls, and the outer surface of the RF coil 204 (e.g., a portion between the two side walls). During a scan, when hot spots may be generated, cool air may be flowed through the air passages of the first and second airflow guides 210 and 211 to cool portions of the body coil assembly proximate to the first and second airflow guides 210 and 211. In various embodiments, the cool air may be generated by an external fan, as shown in FIG. 3. By directing the cool air to the hot spots positioned at the end rings 206, a temperature of the hot spots may be reduced.

FIG. 3 shows a second perspective view of a body coil assembly 300, from a front end of the body coil assembly 300 (e.g., the front end 203 of FIG. 2). The body coil assembly 300 may be a non-limiting example of the body coil assembly 200. The body coil assembly 300 includes an RF tube 302 (e.g., the RF tube 202) and an RF coil 304 (e.g., the RF coil 204), where the RF coil 304 is arranged circumferentially around an outer perimeter of the RF tube 302. The RF tube 202 and the RF coil 304 surround and partially enclose an imaging space 350, into which a subject 380 may be inserted during an MRI. In various embodiments, the subject 380 may be positioned on a table 382 (e.g., table 26 of FIG. 1) that may slide into the imaging space 350 from the front end of the body coil assembly 300.

Heat may be generated in the RF coil 304 while performing the MRI on the subject 380, which may result in hot spots 370, 372, and 374. The hot spots 370, 372, and 374 may radiate heat that is transferred to the RF tube 302. At one or more of the locations of the hot spots 370, 372, and 374, the temperature of the RF tube 302 may increase above a first threshold, where the temperature becomes uncomfortable to the subject 380. Depending on an amount of time taken in performing the MRI, the temperature of the RF tube 302 may increase above a second threshold at the one or more of the locations of the hot spots 370, 372, and 374, where the subject 380 may be exposed to a possibility of cutaneous burns. For example, exposed skin on an arm of the subject 380 may contact a portion of a wall of the RF tube 302 at the location of the hot spot 372, and as a result of the contact, the exposed skin may be subject to temperatures high enough to cause a burn.

To reduce the temperature of the hot spots 370, 372, and 374, one or more airflow guides 310 may be arranged circumferentially around a portion of an outer surface of the RF coil 304. In various embodiments, a first airflow guide 310 may be arranged at a front end of the RF coil 304, and a second airflow guide 310 (not shown in FIG. 3) may be arranged at a rear end of the RF coil 304, where the first and second airflow guides 310 may be aligned along a front and rear rim or edge of RF coil 304, respectively. The first and second airflow guides 310 may extend from a top center point 360 of the RF coil 304, down sides of the RF coil 304 to cover a first portion of the circumference of the RF coil 304, leaving a second portion of the circumference of the RF coil 304 uncovered. In one embodiment, the first and second airflow guides 310 extend halfway down the sides of the RF coil 304 from the top center point 360, covering a top half of the circumference of the RF coil 304 and leaving a bottom half of the circumference of the RF coil 304 uncovered. In other embodiments, either of the first and second airflow guides 310 may extend a greater or lesser distance down the sides of the RF coil 304 from the top center point 360. For example, the first and second airflow guides 310 may extend down the sides of the RF coil 304 to a level of the table 382 of the body coil assembly 300, such that air is guided to hot spots on an inner surface 363 of the RF coil 304 that may come in contact with a subject lying on the table. In one embodiment, the first and second airflow guides 310 may extend all the way around the circumference of the RF coil 304.

Cool air may be routed into an airflow inlet 340 of the one or more airflow guides 310 by a fan 390. It should be appreciated that the airflow inlet 340 is a different airflow inlet than the inlet 560 shown in FIG. 5A, through which cool air may be directed along the RF coil 204 (e.g., in addition to the cool air routed through the one or more airflow guides 310) as described above. The fan 390 may be a same fan used to flow cool air across the RF coil 504 as described in reference to FIG. 5A, or the fan 390 may be a different fan.

The fan 390 may be an external fan having a flexible hose 364 that is coupled to the airflow inlet 340, through which the cool air is directed into the one or more airflow guides 310. In various embodiments, the airflow inlet 340 is positioned at the top center point 360 of the RF coil 304. The cool air may generate a first airflow 342 within the one or more airflow guides 310 at a first side 301 of the RF coil 304. The first airflow may be routed past and directed at hot spots at the first side 301 (e.g., the hot spots 370 and 372). The cool air may generate a second airflow 344 within the one or more airflow guides 310 at a second side 303 of the RF coil 304. The second airflow may be routed past and directed at hot spots at the second side 303 (e.g., the hot spot 374). As a result of the cool air inside the one or more airflow guides 310 being directed at the hot spots 370, 372, and 374, the temperature at the hot spots 370, 372, and 374 may be reduced (e.g., to below the first and second thresholds). The cool air routed past the hot spots 370, 372 of the first side 301 of the RF coil may become heated, and exit the one or more airflow guides 310 at an airflow outlet 348 positioned at a first end of the one or more airflow guides 310. The air routed past the hot spot 374 of the second side 303 of the RF coil may exit the one or more airflow guides 310 at an airflow outlet 346 positioned at a second end of the one or more airflow guides 310.

FIG. 4 shows a third perspective view of a body coil assembly 400, from a side of the body coil assembly 400 (e.g., the first side 301 of FIG. 3). In the third perspective view of FIG. 4, a portion of an RF coil 404 is shown positioned on an RF tube 402, where the RF coil 404 and the RF tube 402 may be non-limiting examples of the RF coil 304 and the RF tube 302 of FIG. 3 and/or the RF coil 204 and the RF tube 202 of FIG. 2. The RF coil 404 has a thickness 420, and the RF coil 404 has a thickness 422, where the thickness 422 may be different from the thickness 420.

Heat may radiate from the RF coil 404 out of the body coil assembly 400, as indicated by a plurality of arrows 450, and heat may radiate from the RF coil 404 into an interior of the body coil assembly 400 (e.g., through the RF tube 402), as indicated by a plurality of arrows 451. Specifically, the heat may radiate from hot spots, where the hot spots may be concentrated at a rear end 401 of the body coil assembly 400 and a front end 403 of the body coil assembly 400 (e.g., as opposed to a middle portion of the body coil assembly 400).

To reduce an amount of heat radiating from the hot spots, the body coil assembly 400 may include a first airflow guide 410 (e.g., airflow guide 210 of FIG. 2) positioned on a surface of the RF coil 404 at the rear end 401 of the body coil assembly 400, and a second airflow guide 411 (e.g., airflow guide 211 of FIG. 2) positioned on the surface of the RF coil 404 at the front end 403 of the body coil assembly 400. As described above in reference to FIGS. 2 and 3, the airflow guide 410 may be circumferentially aligned around the RF coil 404 along a front rim 407 of the body coil assembly 400, and the airflow guide 411 may be circumferentially aligned around the RF coil 404 along a front rim 406 of the body coil assembly 400, where the rear and front rims 407, 406 protrude out from the body coil assembly at a height 424.

Each of the airflow guides 410, 411 may include an upper wall 460, a first side wall 462, and a second side wall 464. An inner surface of each of the upper wall 460, the first side wall 462, and the second side wall 464 may collectively enclose an air passage 440 on three sides, with an outer surface of the RF coil 404 forming a bottom of the air passage 440. In this way, the airflow guides 410, 411 are configured such that the upper wall 460, the first side wall 462, and the second side wall 464 may channel cool air across a portion of the outer surface of the RF coil located under the upper wall 460 and between the first side wall 462 and the second side wall 464.

The first side walls 462 may be inner side walls (e.g., facing towards an opposite end of the RF coil 404), and the second side walls may be outer side walls (e.g., facing away from the opposite end of the RF coil 404). The outer side walls 464 may be advantageously abutted against the rear and front rims 407, 406 of the body coil assembly 400 to maintain an alignment of the airflow guides 410, 411 along each end of the RF coil 404, where hot spots are more likely to develop. The side walls 462 and the side walls 464 may be attached to the surface of the RF coil 404 and/or the rear and front rims 407, 406 to secure the airflow guides 410, 411 against the surface. By securing the airflow guides 410, 411 against the surface, cooled air routed through the air passages 440 may not escape underneath the inner side walls 462 and a detachment of the airflow guides 410, 411 from the RF coil 404 may be prevented. For example, in some embodiments, the side walls 462 and the side walls 464 may be glued to the surface of the RF coil 404 and/or the rear and front rims 407, 406. In other embodiments, the outer side walls 464 may not be abutted against the rear and front rims 407, 406 of the body coil assembly 400, and the outer side walls 464 may be separated from the rear and front rims 407, 406 by a space. The cooled air routed through the air passages 440 may cool the hot spots on the RF coil 404, thereby reducing an amount of heat radiated by the RF coil 404 into the interior of the body coil assembly 400.

In other embodiments, the airflow guides 410, 411 may not include one or more upper and/or side walls, where the airflow guides 410, 411 may be of a different shape that includes the air passage. For example, in one embodiment, one or more of the airflow guides 410, 411 may have a triangular shape, comprising two angled walls that when coupled to the outer surface of the RF coil 404 form the air passage. In another embodiment, one or more of the airflow guides 410, 411 may include a curved wall, where the curved wall and the outer surface of the RF coil 404 form the air passage.

FIG. 6A shows a first expanded view of a first portion of a body coil assembly 600, which may be a non-limiting example of one or more of the body coil assemblies 200, 300, and 400 of FIGS. 2, 3, and 4. As such, the body coil assembly 600 includes an RF coil 604 arranged circumferentially around an RF tube 602, with an airflow guide 610 (e.g., the airflow guide 410 of FIG. 4) positioned on an outer surface of the RF coil 604. The airflow guide 610 is aligned with a rim 606 at a rear end 601 of the body coil assembly 200.

The body coil assembly 600 includes an airflow inlet 640 (e.g., the airflow inlet 340 of FIG. 3), positioned in the RF coil 604 underneath an open bottom of the airflow guide 610. In various embodiments, the airflow inlet 640 may be located at a top center point 660 (e.g., top center point 360) of the body coil assembly 600. Cooled air directed into the airflow guide 610 through the airflow inlet 640 (e.g., via a fan such as the fan 390) may be routed through an air passage of the airflow guide 610 along a portion of the outer surface of the RF coil 604 along the rim 606. The cooled air may be routed in a first direction indicated by an arrow 690, down a first side of the body coil assembly 600, and/or in a second direction indicated by an arrow 692, down a second, opposing side of the body coil assembly 600.

FIG. 6B shows a second expanded view 650 of a second portion of the body coil assembly 600, where an air passage 648 is formed by a first surface of the airflow guide 610, and a second surface of the RF coil 604. The first surface may be formed by an inner surface of an upper wall 670 of the airflow guide 610, an inner surface of a first side wall 672 of the airflow guide 610, an inner surface of a second wall 674 of the airflow guide 610. The airflow guide 610 may include coupling faces (e.g., surfaces that are in face-sharing contact with the RF coil 604), where the first surface extends from a first coupling face to a second coupling face. For example, the first side wall 672 may include the first coupling face 680, and the second side wall 674 may include the second coupling face 682, where the first surface extends from the first coupling face 680 of the first side wall 672, across the upper wall 670, and down to the second coupling face 682 of the second side wall 674. The second surface of the RF coil 604 may extend from the first coupling face 680 to the second coupling face 682 across a portion 678 of the outer surface of the RF coil 604. Heat radiating from the portion 678 of the outer surface of the RF coil 604 may be transferred to the air flowing through the air passage 648, thereby cooling the portion 678.

In other embodiments, the first surface of the airflow guide 610 may be formed by one or more inner surfaces of a different configuration of walls and/or curved surfaces. For example, the first surface may be a curved (e.g., semicircular) surface extending from the first coupling face 680 to the second coupling face 682.

The second portion of the body coil assembly 600 includes an airflow outlet 646 (e.g., the airflow outlet 346 of FIG. 3). The air routed in the first direction 690 may exit the air passage 648 of the airflow guide 610 at the airflow outlet 646. The airflow outlet 646 may be located at an end point 662 of the airflow guide 610. In some embodiments, the air exiting the airflow outlet 646 may be channeled away from the surface of the RF coil 604 via a channel 663 carved into the rim 606. By channeling the air exiting the airflow outlet 646 away from the surface of the RF coil 604, a heat transferred to the air from one or more hotspots on the RF coil 604 may be directed away from the body coil assembly 600, further reducing a temperature of an interior of the body coil assembly 600.

Referring now to FIG. 7A, a first manufacturing method 700 is shown, where the airflow guides may be created using a combination of machining and hot bending. In various embodiments, the airflow guide is manufactured out of plastic. In one embodiment, the airflow guide is machined as a flat airflow guide section 702 with two side walls, as shown in FIGS. 6A and 6B, and then bent into a curved shape to fit a curve of an outer surface of an RF coil of a body coil assembly, such as the body coil assemblies 200, 300, and/or 400. The flat airflow guide section 702 may be bent into the curved shape using hot bending, where heat is applied to the flat airflow guide section 702 as the flat airflow guide section 702 is bent around a portion of a cylinder 704, where the cylinder 704 has a same diameter as the RF coil of the body coil assembly. During hot bending, the flat airflow guide section 702 is placed on top of a mold to be formed and placed in a radiant heater. The flat airflow guide section 702 will gradually soften as the temperature increases, and adhere to the mold. After cooling, the flat airflow guide section 702 may have the form of a curved airflow guide section 706. An advantage of the first manufacturing method is that it may be fast, inexpensive, and reliable.

In some embodiments, a single curved airflow guide section 706 may be created with a desired length of an airflow guide to be attached to the RF coil. In other embodiments, a plurality of shorter curved airflow guide sections may be created. The plurality of shorter curved airflow guide sections may be assembled on the RF coil as segments to generate a segmented airflow guide, as depicted in the body coil assembly 200 of FIG. 2.

For example, FIG. 7B shows a segmented airflow guide 750 comprising a plurality of curved airflow guide segments 752. Each curved airflow guide segment 752 may be machined as a short flat airflow guide section (e.g., similar to the flat section 706), and then the short flat airflow guide section may be bent as described above with respect to FIG. 7A to form the curved airflow guide segment 752. The plurality of curved airflow guide segments 752 may then be combined to form the segmented airflow guide 750. In some embodiments, the plurality of curved airflow guide segments 752 may be glued together to form the segmented airflow guide 750 when installed on an RF coil.

An advantage of the segmented airflow guide 750 over an airflow guide formed from a single curved airflow guide section 706 is that as a result of the airflow guide segments 752 being shorter than the single curved airflow guide section 706, a time and/or a heat used to create the curved airflow guide segment 752 via hot bending may be less than a time and/or heat used to create the single curved airflow guide section 706. Additionally, a first surface area of each curved airflow guide segment 752 may be smaller than a second surface area of the single curved airflow guide section 706. As a result of the first surface area being smaller, an amount of space used during hot bending of the curved airflow guide segment 752 may be reduced. The reduced amount of space may result in less energy being consumed to generate a heat applied to the curved airflow guide segment 752. Additionally or alternatively, the reduced amount of space may allow for concurrent manufacturing of a greater number of curved airflow guide segments 752 more quickly than the single curved airflow guide section 706. Further still, different numbers of the airflow guide segments 752 may be assembled to form airflow guides of various different sizes, for use on RF coils of various different diameters.

In another embodiment, the single curved airflow guide section 706 and/or the curved airflow guide segments 752 may not be machined and curved using hot bending, and may be formed using plastic injection. In still another embodiment, the single curved airflow guide section 706 and/or the curved airflow guide segments 752 may be created using a 3D printer. An advantage of 3D printing is that airflow guides or airflow guide segments may be created with more complex shapes than can be achieved using machining, hot bending, and/or plastic injection.

Figure 8A:
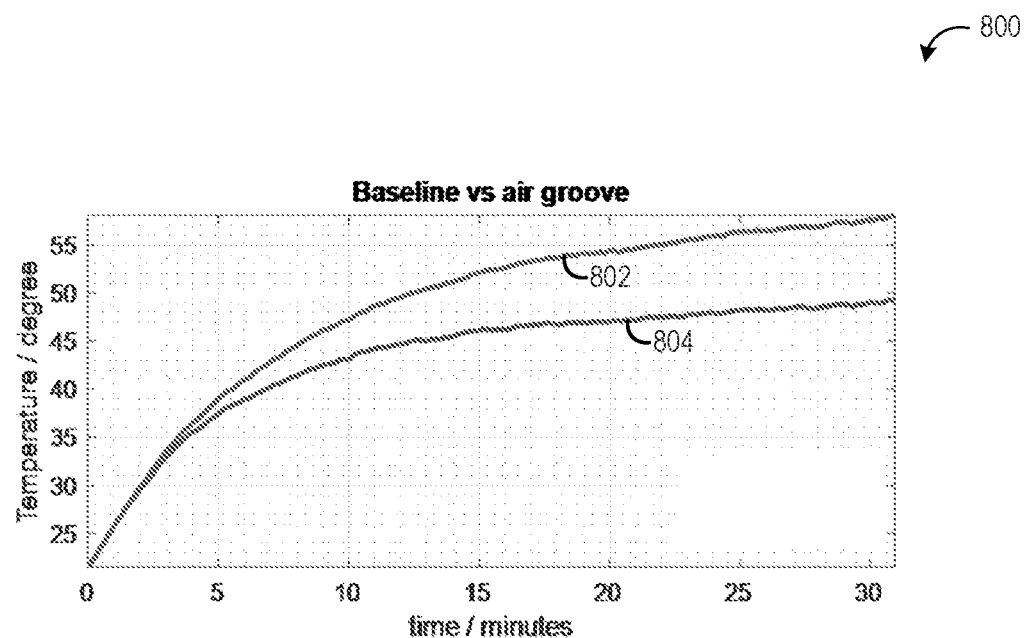
FIG. 8A is a graph comparing a temperature of a first MRI body coil including an airflow guide with a temperature of a second, similar MRI body coil not including the airflow guide, in accordance with one or more embodiments of the present disclosure.

FIG. 8A shows a temperature comparison graph 800 comparing a temperature of a first RF coil including an airflow guide with a temperature of a second, similar RF coil not including the airflow guide, where the first and second RF coils are each included in a body coil assembly, such as the body coil assemblies 200, 300, and/or 400, of an MRI system, such as the MRI system 10 of FIG. 1. The temperature comparison graph 800 includes a vertical axis indicating a temperature of an RF coil (e.g., a hot spot of the RF coil), and a horizontal axis indicating a time of a scan of a subject using the MRI system.

The temperature comparison graph 800 includes a first plot 802, indicating a baseline temperature increase of a first RF coil not including the airflow guide in a first scan, and a second plot 804, indicating a temperature increase of a second RF coil including the airflow guide in a second scan. The first scan and the second scan may be performed under substantially similar conditions. For example, the first RF coil may be of a same type and/or dimensions as the second RF coil, or the second RF coil may be the first RF coil with the airflow guide added to it. The first scan and the second scan may be performed on the same or similar subjects, with similar starting temperatures, and using similar protocols.

Over the course of the first scan, the temperature of the first RF coil increases to a first temperature (e.g., 57° C.), as indicated by first plot 802. Over the course of the second scan (e.g., where the airflow guide is used to cool the second RF coil), the temperature of the second RF coil increases to a second temperature (e.g., 50° C.), where the second temperature is less than the first temperature. A difference between the first plot 802 and the second plot 804 indicates that the temperature of the second RF coil is reduced with respect to the first RF coil as a result of using the airflow guide.

Figure 8B:
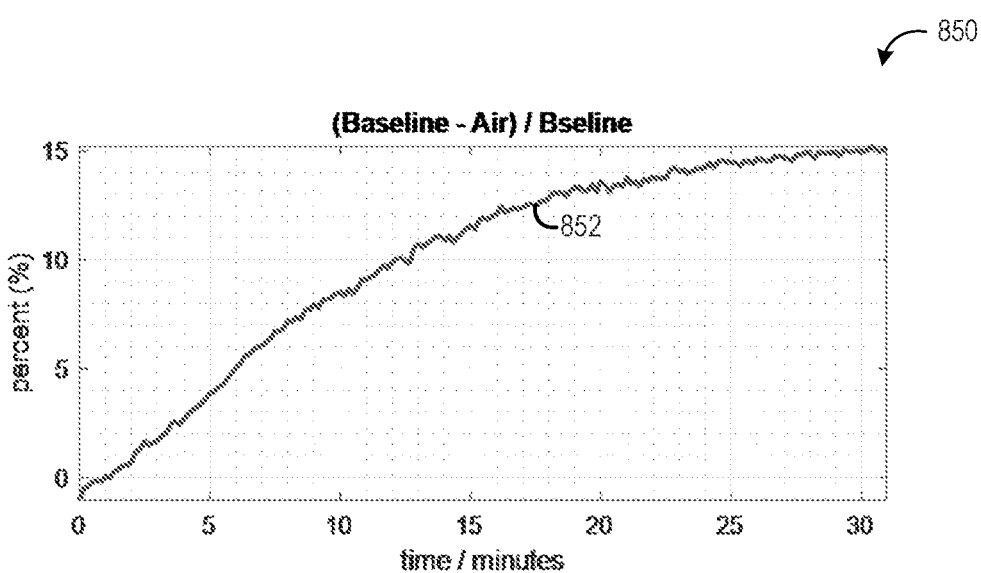
FIG. 8B is a graph showing a percent decrease in a temperature of a first MRI body coil including an airflow guide compared to a second, similar MRI body coil not including the airflow guide, in accordance with one or more embodiments of the present disclosure.

FIG. 8B shows a temperature reduction graph 850 indicating a percent reduction in a temperature of an RF coil achieved by using the airflow guide, based on the plots 802 and 804 of FIG. 8A. The temperature reduction graph 850 includes a vertical axis indicating a percent temperature reduction of the RF coil (e.g., the first RF coil and/or the second RF coil), and a horizontal axis indicating a time of a scan of a subject using the MRI system. The temperature reduction graph 850 includes a plot 852 which indicates a percent reduction in temperature over time during the two scans. As shown by the temperature reduction graph 850, as a result of using the airflow guide, a temperature of the RF coil is reduced by approximately 15% by the end of the scan (e.g., 9° C.).

Thus, hot spots that are generated in a body coil assembly that do not receive sufficient airflow to be cooled via a first cooling method may be cooled via a second, compulsory local cooling method. The second, compulsory local cooling method includes positioning one or more airflow guides around portions of an outer surface of an RF coil of the body coil assembly at one or more locations including the hot spots. For example, the hot spots may be located at ends of the RF coil, where a first airflow guide may be positioned at a first end of the RF coil, and a second airflow guide may be positioned at a second end of the RF coil. The first and second airflow guides may be formed out of a single piece of material (e.g., plastic), or the first and second airflow guides may be formed out of a plurality of segments that are attached (e.g., glued) together. The airflow guides may be manufactured by machine, hot bending, injection molding, 3D printing, or a combination thereof. When the airflow guides are positioned around the portions of the circumference of the RF coil, cool air may be generated by a fan and directed into the airflow guides via an airflow inlet. The cool air may be routed around the RF coil and directed at the hot spots, before exiting the airflow guides via an airflow outlet. For example, the airflow inlets may be located at a top center point of the airflow guides, and the airflow outlets may be located at ends of the airflow guides positioned at sides of the RF coil. By routing the cool air to the hot spots using the airflow guides, a temperature of the RF coil may be reduced. For example, the reduction may be up to 15%. By reducing the temperature, discomfort caused to a subject of an MRI scan positioned inside the RF coil by the hot spots may be reduced, including a possibility of cutaneous burns. An advantage of the systems and methods disclosed herein is that the airflow guides may be produced easily and at a low cost, and can be installed without changing any components of the body coil assembly.

The technical effect of including an airflow guide in a body coil assembly of an MRI system is that a temperature of hot spots generated in an RF coil of the body coil assembly may be reduced, thereby reducing a discomfort caused to a subject of an MRI scan positioned inside the RF coil and a possibility of cutaneous burns of the subject.

The disclosure also provides support for an airflow guide of a body coil assembly of an MRI system, the airflow guide comprising a first surface that forms an air passage when the airflow guide is positioned on the body coil assembly, the air passage enclosed by the first surface and a second, outer surface of an RF coil of the body coil assembly, the airflow guide configured to channel cool air generated by a fan to the second, outer surface of the RF coil. In a first example of the system, the system further comprises: an upper wall, a first side wall, and a second side wall, wherein the first surface comprises an inner surface of the upper wall, the first side wall, and the second side wall. In a second example of the system, optionally including the first example, the first surface is an inner surface of a curved wall. In a third example of the system, optionally including one or both of the first and second examples, the airflow guide is arranged circumferentially around the outer surface of an end of the RF coil. In a fourth example of the system, optionally including one or more or each of the first through third examples, the airflow guide covers a first portion of a circumference of the RF coil, and a second portion of the circumference is not covered by the airflow guide. In a fifth example of the system, optionally including one or more or each of the first through fourth examples, the airflow guide is manufactured by one or more of a machining process, an injection molding process, a 3D printing process, and a hot bending process where a material of the airflow guide is heated and bent around a portion of a cylinder. In a sixth example of the system, optionally including one or more or each of the first through fifth examples, the airflow guide is formed by a plurality of airflow guide segments are manufactured and glued together. In a seventh example of the system, optionally including one or more or each of the first through sixth examples, the cool air enters the airflow guide at an airflow inlet positioned at a top center point on the RF coil. In a eighth example of the system, optionally including one or more or each of the first through seventh examples, the cool air is directed from the airflow inlet circumferentially around two opposite sides of the RF coil. In a ninth example of the system, optionally including one or more or each of the first through eighth examples, the cool air exits the airflow guide at an airflow outlet positioned at a side of the RF coil and is directed away from the RF coil via a channel in a rim of the body coil assembly.

The disclosure also provides support for a method for cooling an RF coil of an MRI system, the method comprising routing cool air to a portion of an outer surface of the RF coil via an air passage of an airflow guide, the air passage formed between a surface of the airflow guide and the portion of the outer surface of the RF coil. In a first example of the method, the airflow guide includes one or more walls, and the air passage is formed by the one or more walls and a portion of the outer surface of the RF coil enclosed by the one or more walls. In a second example of the method, optionally including the first example, the method further comprises: generating the cool air via a fan, and routing the cool air to the airflow guide via a hose. In a third example of the method, optionally including one or both of the first and second examples, the method further comprises: routing the cool air into an airflow inlet of the airflow guide positioned at a top center point on the RF coil. In a fourth example of the method, optionally including one or more or each of the first through third examples, the method further comprises: routing hot air out of the airflow guide via an airflow outlet, and directing the hot air away from the RF coil via a channel in a rim of the body coil assembly.

The disclosure also provides support for an MRI system, comprising: a body coil assembly including an RF coil and an RF tube, a fan, and an airflow guide attached to an outer surface of the RF coil, the airflow guide configured to route cool air generated by the fan to a portion of the outer surface the RF coil. In a first example of the system, the airflow guide includes an upper wall, a first side wall, and a second side wall that channel the cool air across a portion of the outer surface of the RF coil under the upper wall and between the first side wall and the second side wall. In a second example of the system, optionally including the first example, the airflow guide is arranged circumferentially around an end of the RF coil. In a third example of the system, optionally including one or both of the first and second examples, the system further comprises: a channel in a rim of the body coil assembly, where hot air exiting the airflow guide is routed away from the RF coil via the channel. In a fourth example of the system, optionally including one or more or each of the first through third examples, the airflow guide comprises a plurality of airflow guide segments that are glued together, the plurality of airflow guide segments manufactured by one or more of a machining process, an injection molding process, a 3D printing process, and a hot bending process where a flat airflow guide section is heated and bent around a portion of a cylinder.

When introducing elements of various embodiments of the present disclosure, the articles "a," "an," and "the" are intended to mean that there are one or more of the elements. The terms "first," "second," and the like, do not denote any order, quantity, or importance, but rather are used to distinguish one element from another. The terms "comprising," "including," and "having" are intended to be inclusive and mean that there may be additional elements other than the listed elements. As the terms "connected to," "coupled to," etc. are used herein, one object (e.g., a material, element, structure, member, etc.) can be connected to or coupled to another object regardless of whether the one object is directly connected or coupled to the other object or whether there are one or more intervening objects between the one object and the other object. In addition, it should be understood that references to "one embodiment" or "an embodiment" of the present disclosure are not intended to be interpreted as excluding the existence of additional embodiments that also incorporate the recited features.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, the examples and embodiments, in all respects, are meant to be illustrative only and should not be construed to be limiting in any manner.

The invention claimed is:

1. An airflow guide of a body coil assembly of an MRI system, the airflow guide comprising a first surface that forms an air passage when the airflow guide is positioned on the body coil assembly, the air passage enclosed by the first surface and a second, outer surface of an RF coil of the body coil assembly, the airflow guide located at a first end of the RF coil and configured to channel cool air generated by a fan to the second, outer surface of the RF coil.

2. The airflow guide of claim 1, further comprising an upper wall, a first side wall, and a second side wall, wherein the first surface comprises an inner surface of the upper wall, the first side wall, and the second side wall.

3. The airflow guide of claim 1, wherein the first surface is an inner surface of a curved wall.

4. The airflow guide of claim 1, wherein the airflow guide is arranged circumferentially around the outer surface of the first end of the RF coil.

5. The airflow guide of claim 4, wherein the airflow guide covers a first portion of a circumference of the RF coil, and a second portion of the circumference is not covered by the airflow guide.

6. The airflow guide of claim 1, wherein the airflow guide is manufactured by one or more of a machining process, an injection molding process, a 3D printing process, and a hot bending process where a material of the airflow guide is heated and bent around a portion of a cylinder.

7. The airflow guide of claim 1, wherein the airflow guide is formed by a plurality of airflow guide segments are manufactured and glued together.

8. The airflow guide of claim 1, wherein the cool air enters the airflow guide at an airflow inlet positioned at a top center point on the RF coil and is directed from the airflow inlet circumferentially around two opposite sides of the RF coil to outlets on each of the opposite sides of the RF coil.

9. The airflow guide of claim 1, wherein the airflow guide is adjacent to a rim of the body coil assembly, the rim either at a front or a rear of the body coil assembly, the front and the rear each being open ends of the body coil assembly, and wherein the cool air exits the airflow guide at an airflow outlet positioned at a side of the RF coil and is directed away from the RF coil via a channel in the rim of the body coil assembly.

10. The airflow guide of claim 1, wherein the airflow guide is located on the exterior surface of the RF coil and protrudes out from the RF coil.

11. A method for cooling an RF coil of an MRI system, the method comprising routing cool air to a portion of an outer surface of the RF coil located at an end ring of the RF coil via an air passage of an airflow guide, the air passage formed between a surface of the airflow guide and the portion of the outer surface of the RF coil, wherein the airflow guide is directly attached to the outer surface of the RF coil.

12. The method of claim 11, wherein the airflow guide includes one or more walls, and the air passage is formed by the one or more walls and a portion of the outer surface of the RF coil enclosed by the one or more walls.

13. The method of claim 11, further comprising generating the cool air via a fan, and routing the cool air to the airflow guide positioned at a top center point on the RF coil via a hose.

14. The method of claim 11, further comprising:
routing hot air out of the airflow guide via an airflow outlet; and
directing the hot air away from the RF coil via a channel in a rim of the body coil assembly.

15. An MRI system, comprising:
a body coil assembly including an RF coil and an RF tube;
a fan; and
an airflow guide directly attached to an outer surface of the RF coil, the airflow guide configured to route cool air generated by the fan to a portion of the outer surface the RF coil.

16. The MRI system of claim 15, wherein the airflow guide includes an upper wall, a first side wall, and a second side wall that channel the cool air across a portion of the outer surface of the RF coil under the upper wall and between the first side wall and the second side wall.

17. The MRI system of claim 15, wherein the airflow guide is arranged circumferentially around a first end of the RF coil.

18. The MRI system of claim 15, further comprising a channel in a rim of the body coil assembly, where hot air exiting the airflow guide is routed away from the RF coil via the channel.

19. The MRI system of claim 15, wherein the airflow guide comprises a plurality of airflow guide segments that are glued together, the plurality of airflow guide segments manufactured by one or more of a machining process, an injection molding process, a 3D printing process, and a hot bending process where a flat airflow guide section is heated and bent around a portion of a cylinder.

20. The MRI system of claim 17, further comprising a second airflow guide, wherein the second airflow guide is arranged circumferentially around a second end of the RF coil, and wherein the second end of the RF coil is opposite the first end.

* * * * *